(12) United States Patent
Katsushi (10) Patent No.: US 11,744,099 B2
(45) Date of Patent: Aug. 29, 2023

(54) DISPLAY DEVICE

(71) Applicant: Samsung Display Co., Ltd., Yongin-si (KR)

(72) Inventor: Kishimoto Katsushi, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 247 days.

(21) Appl. No.: 16/905,570

(22) Filed: Jun. 18, 2020

(65) Prior Publication Data

US 2021/0143357 A1 May 13, 2021

(30) Foreign Application Priority Data

Nov. 11, 2019 (KR) .................. 10-2019-0143671

(51) Int. Cl.
*H10K 50/17* (2023.01)
*H10K 50/11* (2023.01)
*H10K 50/15* (2023.01)
*H10K 59/122* (2023.01)
*H10K 101/40* (2023.01)

(52) U.S. Cl.
CPC ............. *H10K 50/17* (2023.02); *H10K 50/11* (2023.02); *H10K 50/15* (2023.02); *H10K 59/122* (2023.02); *H10K 2101/40* (2023.02)

(58) Field of Classification Search
CPC combination set(s) only.
See application file for complete search history.

(56) References Cited

U.S. PATENT DOCUMENTS

| | | | |
|---|---|---|---|
| 2016/0133677 A1* | 5/2016 | Yamamoto | H10K 59/122 257/40 |
| 2017/0207282 A1* | 7/2017 | Kishimoto | H01L 51/0005 |
| 2018/0233548 A1* | 8/2018 | Takata | G09G 3/3208 |
| 2019/0198788 A1* | 6/2019 | Park | H01L 51/504 |

FOREIGN PATENT DOCUMENTS

| | | |
|---|---|---|
| JP | 2018-133144 A | 8/2018 |
| JP | 2018-139262 A | 9/2018 |

* cited by examiner

*Primary Examiner* — Moin M Rahman
(74) *Attorney, Agent, or Firm* — Lewis Roca Rothgerber Christie LLP (57) ABSTRACT

A display device may include a substrate, a first electrode on the substrate, a pixel defining layer exposing the first electrode and covering a side of the first electrode, a second electrode on the first electrode, a hole injection layer between the first electrode and the second electrode and having an upper surface having a side protruding toward the second electrode, a light emitting layer between the hole injection layer and the second electrode and having an upper surface having a side protruding toward the second electrode. A shortest distance between a first fixing point between the side of the upper surface of the hole injection layer and the pixel defining layer and a second fixing point between the side of the upper surface of the light emitting layer and the pixel defining layer is greater than or equal to an insulation breakdown limit distance of the light emitting layer.

15 Claims, 7 Drawing Sheets

DISPLAY DEVICE

CROSS-REFERENCE TO RELATED APPLICATION

This application claims priority to and the benefit of Korean Patent Application No. 10-2019-0143671, filed on Nov. 11, 2019 in the Korean Intellectual Property Office (KIPO), the entire disclosure of which is hereby incorporated by reference.

BACKGROUND

1. Field

Embodiments relate to a display device. More particularly, embodiments relate to a display device in which light emission efficiency is improved through prevention or reduction of leakage current.

2. Description of the Related Art

An organic light emitting display device is a self-light emitting display device that displays an image utilizing an organic light emitting diode that emits light. Because the organic light emitting display device has high quality characteristics such as low power consumption, high light emission, high response speed, wide viewing angle, and excellent contrast, the organic light emitting display is attracting attention as a next generation display device.

The organic light emitting display device may include a light emitting layer including an organic light emitting material between a first electrode and a second electrode. When a positive voltage and a negative voltage are respectively applied to these electrodes, holes injected from the first electrode move to the light emitting layer through a hole injection layer and a hole transport layer, electrons are transferred from the second electrode to the light emitting layer through an electron injection layer and an electron transport layer, and the electrons and the holes recombine in the light emitting layer. Excitons are generated by such recombination, and as the excitons change from the excited state to the ground state, the light emitting layer emits light, thereby displaying an image.

A substrate may be disposed below the organic light emitting diode, and the first electrode, the hole injection layer, the hole transport layer, the light emitting layer, the electron transport layer, the electron injection layer, the second electrode, and an encapsulation layer may be sequentially disposed thereon.

A current leakage may occur between the hole injection layer and the second electrode. When the current leakage occurs, performance of the organic light emitting display device including the organic light emitting diode may be degraded or reduced.

SUMMARY

Aspects of embodiments are directed toward a display device. More particularly, aspects of embodiments are directed toward a display device in which light emission efficiency is improved through prevention or reduction of leakage current.

According to example embodiments, a display device may include a substrate, a first electrode on the substrate, a pixel defining layer exposing an upper surface of the first electrode and covering a side of the first electrode, a second electrode on the first electrode, a hole injection layer between the first electrode and the second electrode, the hole injection layer having an upper surface having a side protruding in a direction toward the second electrode, light emitting layer between the hole injection layer and the second electrode, the light emitting layer having an upper surface having a side protruding in the direction toward the second electrode and an electron injection layer between the light emitting layer and the second electrode. Here, a shortest distance between a first fixing point defined at a boundary between the side of the upper surface of the hole injection layer and the pixel defining layer and a second fixing point defined at a boundary between the side of the upper surface of the light emitting layer and the pixel defining layer is greater than or equal to an insulation breakdown limit distance of the light emitting layer.

In an embodiment, the display device further includes a hole transport layer between the hole injection layer and the light emitting layer.

In an embodiment, an ink repellency of the hole injection layer with respect to the pixel defining layer is greater than an ink repellency of the hole transport layer with respect to the pixel defining layer.

In an embodiment, the display device further includes an electron transport layer between the electron injection layer and the light emitting layer.

In an embodiment, a horizontal distance from the first fixing point to a point between a flat portion of the upper surface of the hole injection layer and a curvature portion of the upper surface of the hole injection layer is within a range of 0.5 μm to 3 μm.

In an embodiment, a horizontal distance from the first fixing point to a point between a flat portion of the upper surface of the hole injection layer and a curvature portion of the upper surface of the hole injection layer is 0.5 μm.

In an embodiment, a horizontal distance from the second fixing point to a point between a flat portion of the upper surface of the light emitting layer and a curvature portion of the upper surface of the light emitting layer is within a range of 0.5 μm to 3 μm.

In an embodiment, a horizontal distance from the second fixing point to a point between a flat portion of the upper surface of the light emitting layer and a curvature portion of the upper surface of the light emitting layer is 0.5 μm.

In an embodiment, an ink repellency of the hole injection layer with respect to the pixel defining layer is greater than an ink repellency of the light emitting layer with respect to the pixel defining layer.

In an embodiment, a radius of curvature of a curvature (curve) portion of the side of the upper surface of the hole injection layer is greater than a radius of curvature of a curvature (curve) portion of the side of the upper surface of the light emitting layer.

In an embodiment, the upper surface of the hole injection layer has a 'U' shape.

In an embodiment, the upper surface of the hole injection layer has a flat portion having a greater width than a width of the side of the upper surface of the hole injection layer.

In an embodiment, the upper surface of the hole injection layer has a 'W' shape.

In an embodiment, a height of a flat portion of the upper surface of the hole injection layer is less than a height of the first fixing point and greater than a height of a lowest point of a curvature portion of the upper surface of the hole injection layer. A width of the flat portion of the upper surface of the hole injection layer is greater than a width of the side of the upper surface of the hole injection layer.

In an embodiment, the upper surface of the light emitting layer has a 'U' shape.

In an embodiment, a width of a flat portion of the upper surface of the light emitting layer is greater than a width of the side of the upper surface of the light emitting layer.

In the display device according to the embodiments, the shortest distance between the first fixing point defined at the boundary between the side of the upper surface of the hole injection layer and the pixel defining layer and a second fixing point defined at the boundary between the side of the upper surface of the light emitting layer and the pixel defining layer is greater than or equal to an insulation breakdown limit distance of the light emitting layer. Therefore, current leakage of the display device may be prevented or reduced. Accordingly, the light emitting efficiency of the display device may be improved.

BRIEF DESCRIPTION OF THE DRAWINGS

Illustrative, non-limiting embodiments will be more clearly understood from the following detailed description taken in conjunction with the accompanying drawings.

DETAILED DESCRIPTION

Hereinafter, a display device in accordance with embodiments will be explained in more detail with reference to the accompanying drawings.

As used herein, the use of the term "may," when describing embodiments of the present disclosure, refers to "one or more embodiments of the present disclosure." As used herein, the term "and/or" includes any and all combinations of one or more of the associated listed items. As used herein, the term "substantially," "about," "approximately," and similar terms are used as terms of approximation and not as terms of degree, and are intended to account for the inherent deviations in measured or calculated values that would be recognized by those of ordinary skill in the art.

Spatially relative terms, such as "beneath", "below", "lower", "under", "above", "upper" and the like, may be used herein for ease of description to describe one element or feature's relationship to another element(s) or feature(s) as illustrated in the figures. It will be understood that the spatially relative terms are intended to encompass different orientations of the device in use or in operation, in addition to the orientation depicted in the figures. It will be understood that when an element or layer is referred to as being "on", "connected to", "coupled to", or "adjacent to" another element or layer, it can be directly on, connected to, coupled to, or adjacent to the other element or layer, or one or more intervening element(s) or layer(s) may be present.

Figure 1:
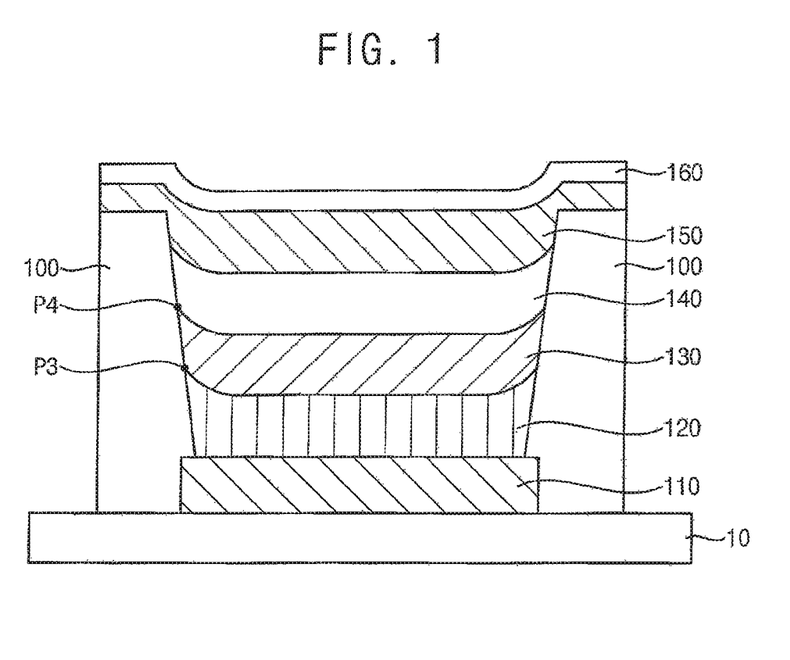
FIG. 1 is a cross-sectional view showing a display device according to an embodiment of the present disclosure.

FIG. 1 is a cross-sectional view showing a display device according to an embodiment of the present disclosure.

Referring to FIG. 1, the display device may include a substrate 10, a pixel defining layer 100, a first electrode 110, a hole injection layer 120, a light emitting layer 130, an electron injection layer 140, a second electrode 150 and an encapsulation layer 160.

The substrate 10 may include an insulating substrate. The insulating substrate may include (e.g., be) a glass material of a transparent material mainly containing transparent silicon oxide, e.g., SiO2 ($SiO_2$). For example, the glass material included in the insulating substrate may be a transparent material that mainly includes (e.g., is) transparent SiO2. In an embodiment, the insulating substrate may include (e.g., be) an opaque material. The insulating substrate may include (e.g., be) a plastic material. In an embodiment, the insulating substrate may be a flexible substrate.

The display device may further include other structures formed on the substrate 10. Examples of the other structures may include a wiring, an electrode, an insulating layer and/or the like. In an embodiment, the display device may include a plurality of thin film transistors formed on the substrate 10. At least one of the plurality of the thin film transistors may be electrically connected to the first electrode 110. The thin film transistors may include an active layer formed of amorphous silicon, polycrystalline silicon, monocrystalline silicon or the like. In an embodiment, the thin film transistors may include the active layer formed of an oxide semiconductor.

The active layer may include a channel region. A source electrode and a drain electrode may be disposed at opposite ends of the channel region. The source electrode and the drain electrode may be formed of a single-layer or a multilayer including (e.g., being) any one of molybdenum (Mo), aluminum (Al), chromium (Cr), gold (Au), titanium (Ti), nickel (Ni), neodymium (Nd), copper (Cu), or an alloy thereof. The display device may further include a protective layer formed to overlap the active layer, the source electrode and the drain electrode. The protective layer may serve to prevent, or reduce the occurrence of, scratches and/or moisture penetration during a manufacturing process. The protective layer may be formed of an inorganic layer, for example, a silicon oxide layer, a silicon nitride layer, or multilayer thereof (e.g., a multilayer structure including at least one silicon oxide layer and at least one silicon nitride layer). The protective layer may be formed utilizing a chemical vapor deposition (CVD) method.

A gate electrode for controlling current of the channel region may be disposed on the channel region. The gate electrode may be formed of the single-layer or a multilayer including (e.g., being) any one of molybdenum (Mo), aluminum (Al), chromium (Cr), gold (Au), titanium (Ti), nickel (Ni), neodymium (Nd), copper (Cu), or an alloy thereof. A gate insulating layer may be disposed between the channel region and the gate electrode. The gate insulating layer may separate (e.g., electrically insulate) the active layer and the gate electrode. The gate insulating layer may be formed of an inorganic layer, for example, a silicon oxide layer, a silicon nitride layer, or a multilayer thereof.

The first electrode 110 may be utilized as a transparent electrode, a reflective electrode or a transflective electrode (e.g., an electrode that transmits a portion of incident light and reflects a portion of incident light). When the first electrode 110 is utilized as the transparent electrode, the first electrode 110 may include (e.g., be) indium tin oxide (ITO), indium zinc oxide (IZO), zinc oxide (ZnO) and/or indium oxide, e.g., In2O3 ($In_2O_3$). When the first electrode 110 is utilized as the reflective electrode, the first electrode 110 may include a reflective layer formed of Ag, Mg, Al, Pt, Pd, Au, Ni, Nd, Ir, Cr, a compound thereof, and/or the like and/or a transmitting layer formed of ITO, IZO, ZnO Or In2O3. When the first electrode 110 is utilized as the transflective electrode, the first electrode 110 may include a reflective layer formed of Ag, Mg, Al, Pt, Pd, Au, Ni, Nd, Ir, Cr, a compound thereof, and/or the like, and/or a transmitting layer formed of ITO, IZO, ZnO and/or In2O3. The first electrode 110 may be formed utilizing a photolithography method, but is not limited thereto.

When the first electrode 110 is utilized as the transparent electrode, the display device may be a bottom emission type or kind in which light generated from the light emitting layer 130 is emitted toward the first electrode 110. When the first electrode 110 is utilized as the reflective electrode, the display device may be a top emission type or kind in which light generated from the light emitting layer 130 is emitted toward the second electrode 150. When the first electrode 110 is utilized as the transflective electrode, the display device may be a bottom emission type or kind in which light generated from the light emitting layer 130 is emitted toward the first electrode 110 and may have a resonance structure, or the display device may be a dual emission type or kind in which light generated from the light emitting layer 130 is emitted toward both the first electrode 110 and the second electrode 150. For example, when the first electrode 110 is utilized as the transflective electrode, the light generated from the light emitting layer 130 may resonate.

The pixel defining layer 100 may cover a side of the first electrode 110 and be disposed on the substrate 10. The pixel defining layer 100 may have an opening that exposes an upper surface (e.g., a portion of an upper surface) of the first electrode 110. A side surface of the pixel defining layer 100 (e.g., a side surface of the opening of the pixel defining layer 100) may be inclined.

The hole injection layer 120, the light emitting layer 130, the electron injection layer 140, the second electrode 150, the encapsulation layer 160 and the like may be disposed on the first electrode 110 exposed by the opening of the pixel defining layer 100. The pixel defining layer 100 may include (e.g., be) an insulating material. For example, the pixel defining layer 100 may include (e.g., be) at least one organic material selected from benzocyclobutene (BCB), polyimide (PI), polyamide (PA), acrylic resin, phenol resin and the like. As another example, the pixel defining layer 100 may include (e.g., be) an inorganic material such as silicon nitride.

The hole injection layer 120 may serve as a buffer to lower the energy barrier between the first electrode 110 and the light emitting layer 130. The hole injection layer 120 may easily inject holes provided from the first electrode 110 into the light emitting layer 130. The hole injection layer 120 may include (e.g., be) an organic material, for example, MTDATA(4,4',4"-tris(3-methylphenylphenylam ino)triph-enylam ine), CuPc(copper phthalocyanine), PEDOT/PSS (poly(3,4-ethylenedioxythiphene, polystyrene sulfonate) and/or the like.

A thickness of the hole injection layer 120 may become thicker from a central (e.g., center) flat portion of the hole injection layer 120 toward the pixel defining layer 100. For example, a portion of the hole injection layer 120 that abuts against the pixel defining layer 100 may be thicker than a center flat portion of the hole injection layer 120.

In an embodiment, an ink repellency of the hole injection layer 120 with respect to the pixel defining layer 100 may be greater than an ink repellency of the light emitting layer 130 with respect to the pixel defining layer 100. As used herein, ink repellency may refer to the repulsive force of the material of one layer or component with respect to the material of another layer or component. For example, the repulsive force of the material of the hole injection layer 120 with respect the material of the pixel defining layer 100 may be greater than the repulsive force of the material of the light emitting layer 130 with respect to the material of the pixel defining layer 100.

The light emitting layer 130 may be disposed on the hole injection layer 120 inside the pixel defining layer 100 (e.g., inside the opening of the pixel defining layer 100). The light emitting layer 130 may emit light by recombining holes provided from the first electrode 110 and electrons provided from the second electrode 150. In more detail, when the holes and the electrons are provided to the light emitting layer 130, the holes and the electrons may be recombined to form excitons. The excitons may change energy from an excited state to a ground state and release energy in the form of light.

The light emitting layer 130 may include, for example, a red light emitting layer to emit red color. The red light emitting layer may include (e.g., be) one red light emitting material or may include (e.g., be) a host and a red dopant. Examples of the host of the red light emitting layer may be Alq3, CBP(4,4'-N,N'-dicarbazol-biphenyl), PVK(poly(n-vi-nylcarbaxol)), ADN(9,10-Di(naphthyl-2-yl)anthrace), TCTA, TPBI(1,3,5-tris(N-phenylbenzimidazol-2-yl)benzene), TBADN(3-tert-butyl-9,10-di(naphth-2-yl) anthracene), E3, DSA(distyrylarylene) and/or the like, but is not limited thereto. Examples of the red dopant may be PtOEP, Ir(piq)3, Btp2Ir(acac) and/or the like, but is not limited thereto.

The light emitting layer 130 may include, for example, a green light emitting layer to emit green color. The green light emitting layer may include (e.g., be) one green light emitting material or may include (e.g., be) a host and a green dopant. The host of the green light emitting layer may be the same as the host of the red light emitting layer. Examples of the green dopant may be Ir(ppy)3, Ir(ppy)2(acac), Ir(mpyp)3 and/or the like, but is not limited thereto.

The light emitting layer 130 may include, for example, a blue light emitting layer to emit blue color. The blue light emitting layer may include (e.g., be) one blue light emitting material or may include (e.g., be) a host and a blue dopant. The host of the blue light emitting layer may be the same as the host of the red light emitting layer. Examples of the blue dopant may be F2Irpic, (F2ppy)2Ir(tmd), Ir(dfppz)3, ter-fluorene, DPAVBi(4,4'-bis(4-diphenylaminostyryl) biphenyl), TBPe(2,5,8,11-tetra-tert-butyl pherylene) and/or the like, but is not limited thereto.

A wavelength of the red light may be about 650 nm, a wavelength of the green light may be about 550 nm and a wavelength of the blue light may be about 430 nm. As used herein, the term nm may refer to a distance equal to $10^{-9}$ meters.

A thickness of the light emitting layer 130 may become thinner from a central (e.g., center) flat portion of the light emitting layer 130 toward the pixel defining layer 100. For example, a portion of the light emitting layer 130 that abuts against the pixel defining layer 100 may be thinner than a center flat portion of the light emitting layer 130.

The electron injection layer 140 may be disposed on the light emitting layer 130. The electron injection layer 140 may serve as a buffer to lower an energy barrier between the light emitting layer 130 and the second electrode 150. The electron injection layer 140 may allow the electrons provided from the second electrode 150 to be easily injected into the light emitting layer 130. The electron injection layer 140 may be formed of, for example, lithium fluoride (LiF) and/or cesium fluoride (CsF), but is not limited thereto. The electron injection layer 140 may be formed through a deposition method, but is not limited thereto.

A thickness of the electron injection layer 140 may become thinner from a central (e.g., center) flat portion of the electron injection layer 140 toward the pixel defining layer 100. For example, a portion of the electron injection layer 140 that abuts against the pixel defining layer 100 may be thinner than a center flat portion of the electron injection layer 140.

The second electrode 150 may be disposed on the electron injection layer 140 and may be a cathode electrode that provides the electrons to the light emitting layer 130. The second electrode 150 may be utilized as a transparent electrode, a reflective electrode, or a transflective electrode. When the second electrode 150 is utilized as the transparent electrode, the display device may be a top emission type or kind in which light generated from the light emitting layer 130 is emitted toward the second electrode 150. When the second electrode 150 is utilized as the reflective electrode, the display device may be the bottom emission type or kind in which light generated from the light emitting layer 130 is emitted toward the first electrode 110. When the second electrode 150 is utilized as the transflective electrode, the display device may be the top emission type or kind in which light generated from the light emitting layer 130 is emitted toward the second electrode 150 and may have a resonance structure. For example, when the second electrode 150 is utilized as the transflective electrode, the light generated from the light emitting layer 130 may resonate. The second electrode 150 may be formed utilizing a deposition method, but is not limited thereto.

The encapsulation layer 160 may prevent or block external oxygen and/or moisture from penetrating into an organic light emitting diode. When the encapsulation layer 160 is formed in a single-layer structure, impurities may penetrate through the encapsulation layer 160. Therefore, the encapsulation layer 160 may have a multilayer structure. When the encapsulation layer 160 is formed only of an organic layer or an inorganic layer, the oxygen and/or the moisture may penetrate from the outside through a minute passage (e.g., a pinhole) formed in the encapsulation layer 160. Therefore, in order to prevent or reduce the occurrence of the minute passage interconnected from the encapsulation layer 160 to the organic light emitting diode, the encapsulation layer 160 may have a layered structure in which an organic layer and an inorganic layer are alternately stacked.

An outermost (e.g., uppermost) layer of the encapsulation layer 160 may be an inorganic layer including (e.g., being) a material such as silicon nitride and/or silicon oxide. This is because the inorganic layer has a higher mechanical strength than that of the organic layer.

In some embodiments, a first fixing point P3 may be defined as a point where a side of an upper surface of the hole injection layer 120 contacts the pixel defining layer 100. A second fixing point P4 may be defined as a point where a side of an upper surface of the light emitting layer 130 contacts the pixel defining layer 100. A shortest distance between the first fixing point P3 and the second fixing point P4 may be greater than or equal to an insulation breakdown limit distance of the light emitting layer 130. In more detail, a difference between a vertical distance between the second fixing point P4 and the upper surface of the first electrode 110 and a vertical distance between the first fixing point P3 and the upper surface of the first electrode 110 may be greater than or equal to the insulation breakdown limit distance of the light emitting layer 130 at a set or predetermined voltage.

The insulation breakdown limit distance may mean a minimum distance between the light emitting layer 130 and a layer disposed below the light emitting layer 130 to insulate the layer disposed below the light emitting layer 130 from the light emitting layer 130 at the set or predetermined voltage. For example, the insulation breakdown limit distance may refer to the minimum thickness of the light emitting layer 130 required to prevent or substantially prevent a current from flowing through the light emitting layer 130 when a set voltage is applied across the light emitting layer 130.

If points where the pixel defining layer 100 contacts the upper surface of the hole injection layer 120, the pixel defining layer 100 contacts the upper surface of the light emitting layer 130 and the pixel defining layer 100 contacts the upper surface of the electron injection layer 140 are adjacent to or closer than a reference or set thickness, current leakage may occur. In order to prevent or reduce the current leakage, each of the hole injection layer 120, the light emitting layer 130, and the electron injection layer 140 may have various suitable shapes.

In some embodiments, the upper surface of each of the hole injection layer 120, the light emitting layer 130, and the electron injection layer 140 may be formed in a 'U' shape by giving curvatures at opposite sides toward the second electrode 150. This may prevent or reduce the current leakage.

A height of a central (e.g., center) flat portion of the upper surface of the hole injection layer 120 may be lower than a height of a highest point of a side of the upper surface of the hole injection layer 120. A height of a central (e.g., center) flat portion of the upper surface of the light emitting layer 130 may be lower than a height of a highest point of a side of the upper surface of the light emitting layer 130. A height of a central (e.g., center) flat portion of the upper surface of the electron injection layer 140 may be lower than a height of a highest point of the side of the upper surface of the electron injection layer 140. A width (e.g., horizontal width) of the central (e.g., center) flat portion of the upper surface of the hole injection layer 120 may be wider than a width (e.g., horizontal width) of the side of the upper surface of the hole injection layer 120. A width (e.g., horizontal width) of the central (e.g., center) flat portion of the upper surface of the light emitting layer 130 may be wider than a width (e.g., horizontal width) of the side of the upper surface of the light emitting layer 130. A width (e.g., horizontal width) of the central (e.g., center) flat portion of the upper surface of the electron injection layer 140 may be wider than a width (e.g., horizontal width) of the side of the upper surface of the electron injection layer 140.

The first fixing point P3 and the second fixing point P4 may not contact each other. Because the upper surface of each of the hole injection layer 120, the light emitting layer 130, and the electron injection layer 140 has a 'U' shape, points at which the upper surface of each of the hole injection layer 120, the light emitting layer 130, and the electron injection layer 140 contact the pixel defining layer 100 may be spaced apart from each other to prevent or reduce current leakage.

Figure 2:
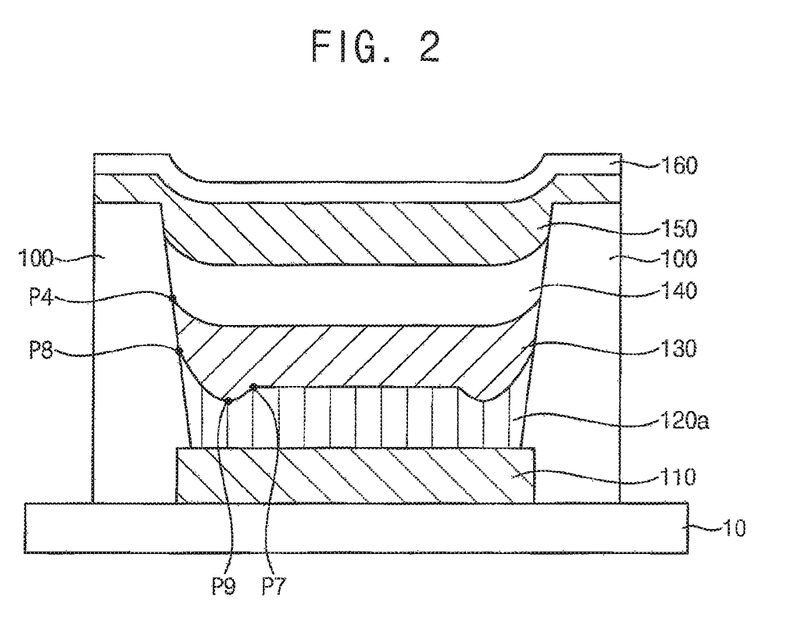
FIG. 2 is a cross-sectional view showing a display device in which a shape of an upper surface of a hole injection layer is modified from the display device in FIG. 1.

FIG. 2 is a cross-sectional view showing a display device in which a shape of an upper surface of a hole injection layer is modified from the display device in FIG. 1.

The display device in FIG. 2 may be substantially the same as or similar to the display device in FIG. 1 except for the shape of the upper surface of the hole injection layer 120a. Accordingly, description of repeated elements may not be repeated.

Referring to FIG. 2, the upper surface of the hole injection layer 120a may have a first fixing point P8 in contact with the pixel defining layer 100. The first fixing point P8 may be a highest point of the upper surface of the hole injection layer 120a. The upper surface of the hole injection layer 120a may have a lowest point P9. The upper surface of the hole injection layer 120a may have a starting point P7 of a central (e.g., center) flat portion. A height of the starting point P7 may be lower than a height of the first fixing point P8 and higher than a height of the lowest point P9. The upper surface of the hole injection layer 120a may be formed as a 'W' shape (e.g., may have a 'W' shape) in which the central (e.g., center) flat portion has a wider width (e.g., horizontal width) than that of curvature portions of the opposite sides of the upper surface of the hole injection layer 120a.

A drying process may be performed during manufacturing of the display device. In the drying process, a height of the central (e.g., center) flat portion of the upper surface of each of the hole injection layer 120a, the light emitting layer 130, and the electron injection layer 140 may be lowered. The thickness in a vertical direction of the central (e.g., center) flat portion may be narrowed (e.g., reduced). When the hole injection layer 120a is formed as the 'W' shape, the height of the central (e.g., center) flat portion of the upper surface of the hole injection layer 120a may not be lower than the height of the central (e.g., center) flat portion of the upper surface of the 'U' shaped hole injection layer. For example, the height of the center flat portion of the upper surface of the hole injection layer 120a in embodiments where the hole injection layer 120a has a 'W' shape may be the same or substantially the same as in embodiments where the hole injection layer has a 'U' shape. Accordingly, the height of the central (e.g., center) flat portion of the upper surface of each of the light emitting layer 130 and the electron injection layer 140 may not be lower than in embodiments where the hole injection layer has a 'U' shape. For example, the height of each of the light emitting layer 130 and the electron injection layer 140 in embodiments where the hole injection layer 120a has a 'W' shape may be the same or substantially the same as in embodiments where the hole injection layer has a 'U' shape.

The second fixing point P4 may be the point where the side of the upper surface of the light emitting layer 130 contacts the pixel defining layer 100. The first fixing point P8 and the second fixing point P4 may not contact each other. The upper surface of the hole injection layer 120a may be formed as the 'W' shape (e.g., may have the 'W' shape), and the upper surface of each of the light emitting layer 130 and the electron injection layer 140 may be formed as the 'U' shape (e.g., may have the 'U' shape). Accordingly, the points where the upper surface of each of the hole injection layer 120a, the light emitting layer 130, and the electron injection layer 140 contact the pixel defining layer 100 may be spaced apart from each other to prevent or reduce the current leakage.

Figure 3:
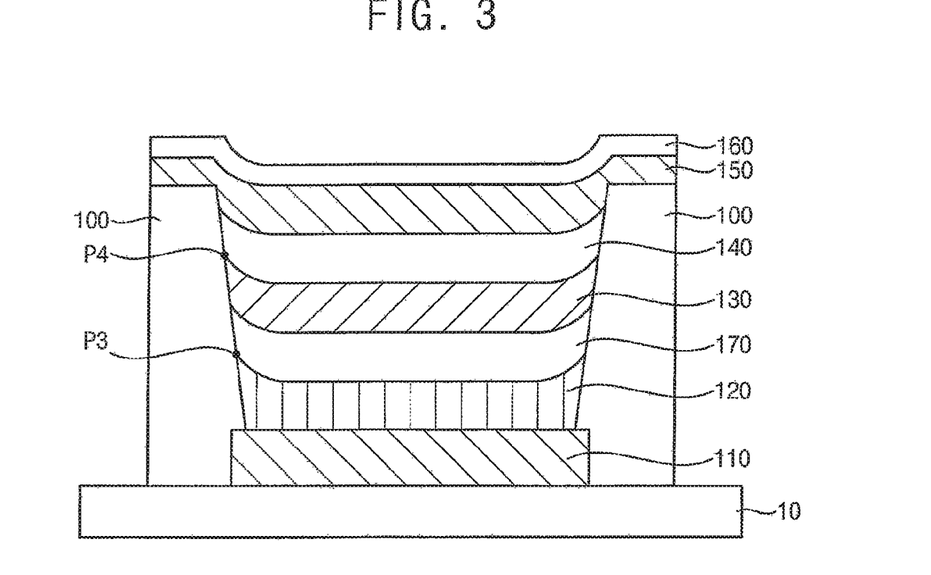
FIG. 3 is a cross-sectional view showing a display device in which a hole transport layer is added to the display device in FIG. 1.

FIG. 3 is a cross-sectional view showing a display device in which a hole transport layer is added to the display device in FIG. 1.

The display device in FIG. 3 may be substantially the same as or similar to the display device in FIG. 1 except that a hole transport layer 170 is added between the hole injection layer 120 and the light emitting layer 130. Accordingly, description of repeated elements may not be repeated.

Referring to FIG. 3, the hole transport layer 170 may transfer the holes provided from the hole injection layer 120 to the light emitting layer 130. For example, the hole transport layer 170 may transfer the holes received from the first electrode 110 through the hole injection layer 120 to the light emitting layer 130. The hole transport layer 170 may be formed of a hole transport material having a lower electrical conductivity than the hole injection layer 120. The hole transport layer 170 may be formed of an organic material, for example, TPD(N,N'-diphenyl-N,N'-bis(3-methylphenyl)-1,1'-bi-phenyl-4,4'-diamine) and/or NPB(N,N'-di(naphthalen-1-yl)-N,N'-diphenyl-benzidine), but is not limited thereto.

The first fixing point P3 may be the point where the side of the upper surface of the hole injection layer 120 contacts the pixel defining layer 100. The second fixing point P4 may be the point where the side of the upper surface of the light emitting layer 130 contacts the pixel defining layer 100. The first fixing point P3 and the second fixing point P4 may not contact each other. The upper surface of each of the hole injection layer 120, the light emitting layer 130, the electron injection layer 140, and the hole transport layer 170 may be formed as the 'U' shape (e.g., may have the 'U' shape). Accordingly, points where the upper surface of each of the hole injection layer 120, the light emitting layer 130, the electron injection layer 140, and the hole transport layer 170 contact the pixel defining layer 100 may be spaced apart from each other to prevent or reduce the current leakage.

The thickness of the hole transport layer 170 may become thinner from the central (e.g., center) flat portion of the hole transport layer 170 toward the pixel defining layer 100. For example, a portion of the hole transport layer 170 that abuts against the pixel defining layer 100 may be thinner than a center flat portion of the hole transport layer 170.

In an embodiment, the ink repellency of the hole injection layer 120 with respect to the pixel defining layer 100 may be greater than the ink repellency of the hole transport layer 170 with respect to the pixel defining layer 100.

Figure 4:
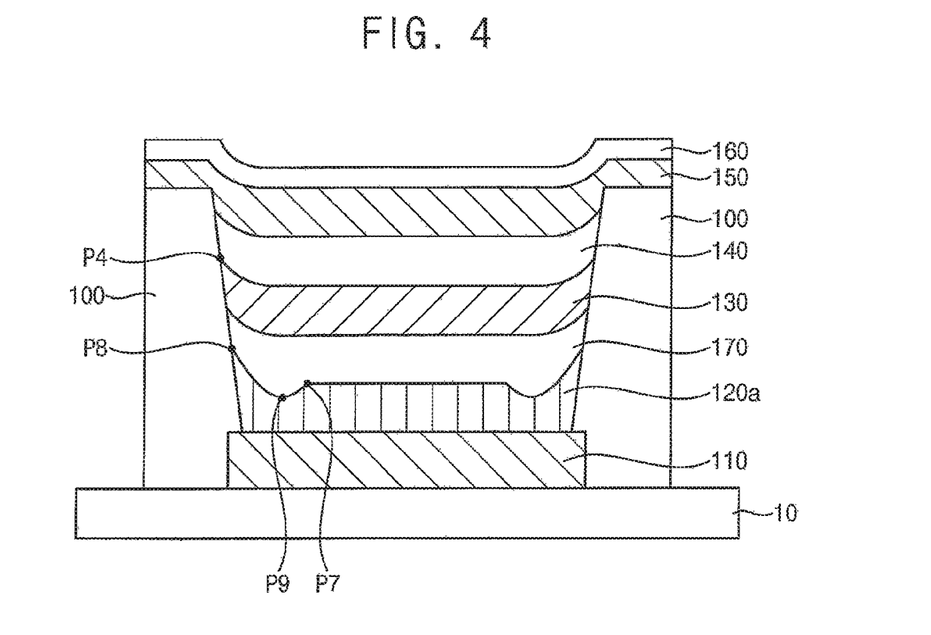
FIG. 4 is a cross-sectional view showing a display device in which a shape of an upper surface of a hole injection layer is modified from the display device in FIG. 3.

FIG. 4 is a cross-sectional view showing a display device in which a shape of an upper surface of a hole injection layer is modified from the display device in FIG. 3.

The display device in FIG. 4 may be substantially the same as or similar to the display device in FIG. 3 except for the shape of the upper surface of the hole injection layer 120a. Accordingly, description of repeated elements may not be repeated.

Referring to FIG. 4, the upper surface of the hole injection layer 120a may have the first fixing point P8 in contact with the pixel defining layer 100. The first fixing point P8 may be the highest point of the upper surface of the hole injection layer 120a. The upper surface of the hole injection layer 120a may have the lowest point P9. The upper surface of the hole injection layer 120a may have the starting point P7 of the central (e.g., center) flat portion. The height of the starting point P7 may be lower than the height of the first fixing point P8 and higher than the height of the lowest point P9. The upper surface of the hole injection layer 120a may be formed as the 'W' shape (e.g., may have the 'W' shape) in which the central (e.g., center) flat portion has a wider width (e.g., horizontal width) than that of the curvature portion of the both sides of the upper surface of the hole injection layer 120a.

The drying process may be performed during manufacturing of the display device. In the drying process, the height of the central (e.g., center) flat portion of the upper surface of each of the hole injection layer 120a, the light emitting layer 130, the electron injection layer 140 and the hole transport layer 170 may be lowered. The thickness in the vertical direction of the central (e.g., center) flat portion may be narrowed (e.g., reduced). When the hole injection layer 120a is formed as the 'W' shape, the height of the central (e.g., center) flat portion of the upper surface of the hole injection layer 120a may not be lower than the height of the central (e.g., center) flat portion of the upper surface of the 'U' shaped hole injection layer. For example, the height of the center flat portion of the upper surface of the hole injection layer 120a in embodiments where the hole injection layer 120a has a 'W' shape may be the same or substantially the same as in embodiments where the hole injection layer has a 'U' shape. Therefore, the height of the central (e.g., center) flat portion of the upper surface of each of the light emitting layer 130, the electron injection layer 140 and the hole transport layer 170 may not be lower than in embodiments where the hole injection layer has a 'U' shape. For example, the height of each of the light emitting layer 130, the electron injection layer 140, and the hole transport layer 170 in embodiments where the hole injection layer 120a has a 'W' shape may be the same or substantially the same as in embodiments where the hole injection layer has a 'U' shape.

The second fixing point P4 may be the point where the side of the upper surface of the light emitting layer 130 contacts the pixel defining layer 100. The first fixing point P8 and the second fixing point P4 may not contact each other. The upper surface of the hole injection layer 120a may be formed as the 'W' shape (e.g., may have the 'W' shape). The upper surface of each of the light emitting layer 130, the electron injection layer 140 and the hole transport layer 170 may be formed as the 'U' shape (e.g., may have the 'U' shape). Accordingly, the points where the upper surface of each of the hole injection layer 120a, the light emitting layer 130, the electron injection layer 140, and the hole transport layer 170 contact the pixel defining layer 100 may be spaced apart from each other to prevent or reduce the current leakage.

Figure 5:
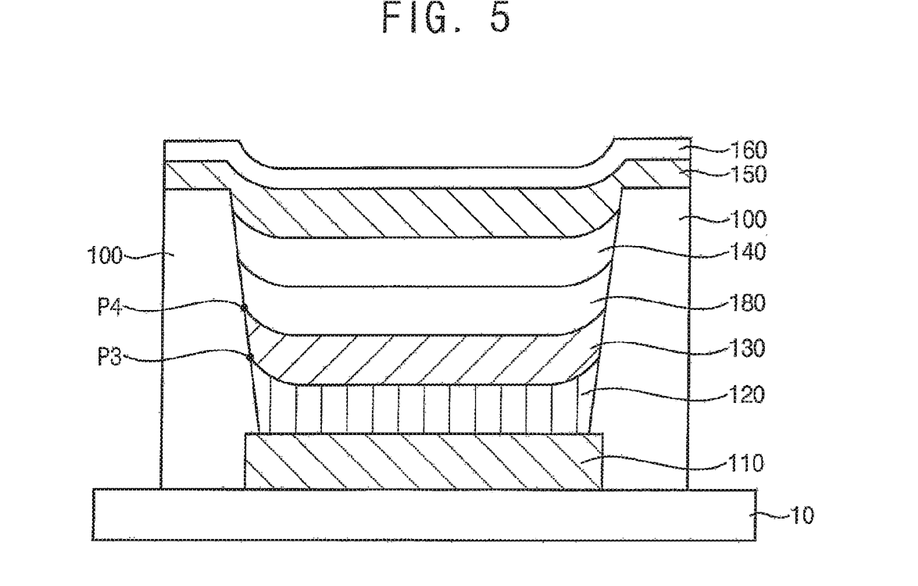
FIG. 5 is a cross-sectional view showing a display device in which an electron transport layer is added to the display device in FIG. 1.

FIG. 5 is a cross-sectional view showing a display device in which an electron transport layer is added to the display device in FIG. 1.

The display device in FIG. 5 may be substantially the same as or similar to the display device in FIG. 1 except that an electron transport layer 180 is added between the electron injection layer 140 and the light emitting layer 130. Accordingly, description of repeated elements may not be repeated.

Referring to FIG. 5, The electron transport layer 180 may be disposed on the light emitting layer 130. The electron transport layer 180 may transfer the electrons received from the second electrode 150 through the electron injection layer 140 to the light emitting layer 130. The electron transport layer 180 may be formed of an organic material. For example, the organic material may include (e.g., be) Bphen (4,7-diphenyl-1,10-phenanthroline), BAlq, Alq3 (Tris(8-quinolinorate)aluminum), Bebq2(berylliumbis(benzoquinolin-10-olate)), TPBI, and/or the like, but is not limited thereto. The electron transport layer 180 may be formed utilizing a deposition method, but is not limited thereto.

The first fixing point P3 and the second fixing point P4 may not contact each other. The upper surface of each of the hole injection layer 120, the light emitting layer 130, the electron injection layer 140, and the electron transport layer 180 may each be formed as the 'U' shape (e.g., may have the 'U' shape). Accordingly, the points where the upper surface of each of the hole injection layer 120, the light emitting layer 130, the electron injection layer 140, and the electron transport layer 180 contact the pixel defining layer 100 may be spaced apart from each other to prevent or reduce the current leakage.

A thickness of the electron transport layer 180 may become thinner from the central (e.g., center) flat portion of the electron transport layer 180 toward the pixel defining layer 100. For example, a portion of the electron transport layer 180 that abuts against the pixel defining layer 100 may be thinner than a center flat portion of the electron transport layer 180.

Figure 6:
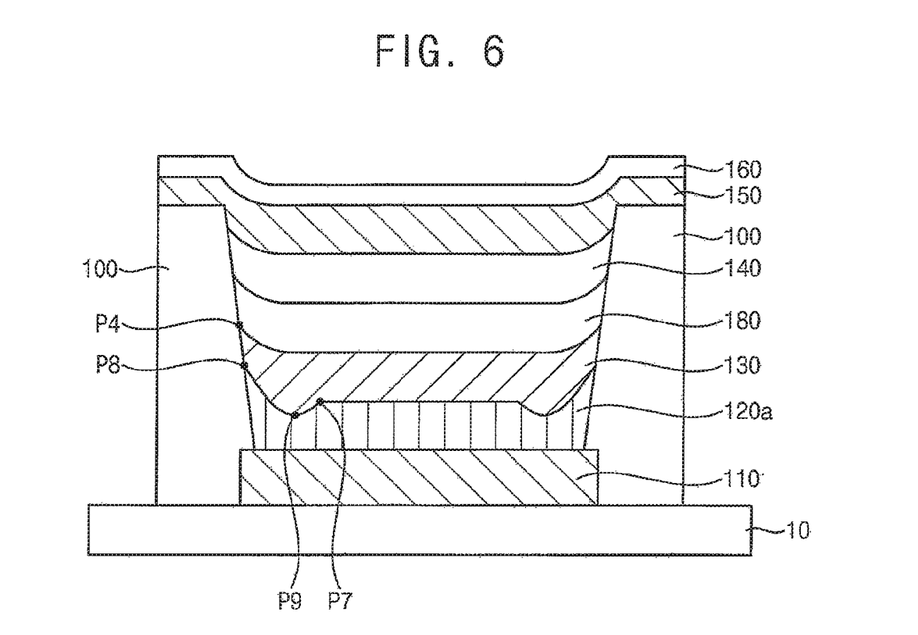
FIG. 6 is a cross-sectional view showing a display device in which a shape of an upper surface of a hole injection layer is modified from the display device in FIG. 5.

FIG. 6 is a cross-sectional view showing a display device in which a shape of an upper surface of a hole injection layer is modified from the display device in FIG. 5.

The display device in FIG. 6 may be substantially the same as or similar to the display device in FIG. 5 except for the shape of the upper surface of the hole injection layer 120a. Accordingly, description of repeated elements may not be repeated.

Referring to FIG. 6, the upper surface of the hole injection layer 120a may have the first fixing point P8 in contact with the pixel defining layer 100. The first fixing point P8 may be the highest point of the upper surface of the hole injection layer 120a. The upper surface of the hole injection layer 120a may have the lowest point P9. The upper surface of the hole injection layer 120a may have the starting point P7 of the central (e.g., center) flat portion. The height of the starting point P7 may be lower than the height of the first fixing point P8 and higher than the height of the lowest point P9. The upper surface of the hole injection layer 120a may be formed as the 'W' shape (e.g., may have the 'W' shape) in which the central (e.g., center) flat portion has a wider width than that of the curvature portion of the both sides of the upper surface of the hole injection layer 120a.

The drying process may be performed during manufacturing of the display device. In the drying process, the height of the central (e.g., center) flat portion of the upper surface of each of the hole injection layer 120a, the light emitting layer 130, the electron injection layer 140 and the electron transport layer 180 may be lowered. The thickness in the vertical direction of the central (e.g., center) flat portion may be narrowed (e.g., reduced). When the hole injection layer 120a is formed as the 'W' shape, the height of the central (e.g., center) flat portion of the upper surface of the hole injection layer 120a may not be lower than the height of the central (e.g., center) flat portion of the upper surface of the 'U' shaped hole injection layer. For example, the height of the center flat portion of the upper surface of the hole injection layer 120a in embodiments where the hole injection layer 120a has a 'W' shape may be the same or substantially the same as in embodiments where the hole injection layer has a 'U' shape. Therefore, the height of the central (e.g., center) flat portion of the upper surface of each of the light emitting layer 130, the electron injection layer 140 and the electron transport layer 180 may not be lower than in embodiments where the hole injection layer has a 'U' shape. For example, the height of each of the light emitting layer 130, the electron injection layer 140, and the electron transport layer 180 in embodiments where the hole injection layer 120a has a 'W' shape may be the same or substantially the same as in embodiments where the hole injection layer has a 'U' shape.

The first fixing point P8 and the second fixing point P4 may not contact each other. The upper surface of the hole injection layer 120a may be formed as the 'W' shape (e.g., may have the 'W' shape). The upper surface of each of the light emitting layer 130, the electron injection layer 140 and the electron transport layer 180 may be formed as the 'U' shape (e.g., may have the 'U' shape). Accordingly, the points where the upper surface of each of the hole injection layer 120a, the light emitting layer 130, the electron injection layer 140, and the electron transport layer 180 contact the pixel defining layer 100 may be spaced apart from each other to prevent or reduce the current leakage.

Figure 7:
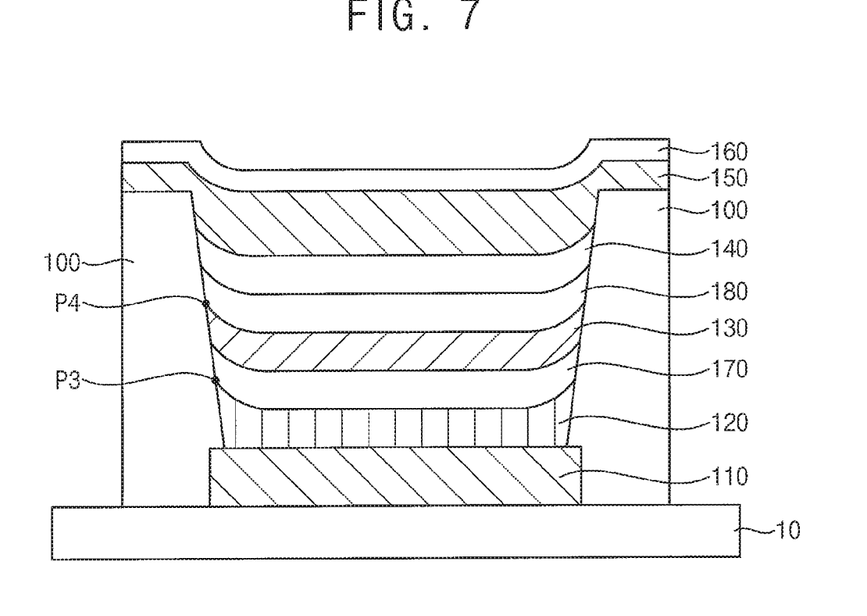
FIG. 7 is a cross-sectional view showing a display device in which a hole transport layer and an electron transport layer are added to the display device in FIG. 1.

FIG. 7 is a cross-sectional view showing a display device in which a hole transport layer and an electron transport layer are added to the display device in FIG. 1.

The display device in FIG. 7 may be substantially the same as or similar to the display device in FIG. 1 except that the hole transport layer 170 and the electron transport layer 180 are added. FIG. 7 may be understood with reference to FIGS. 1, 3, and 5. Accordingly, description of repeated elements may not be repeated.

Figure 8:
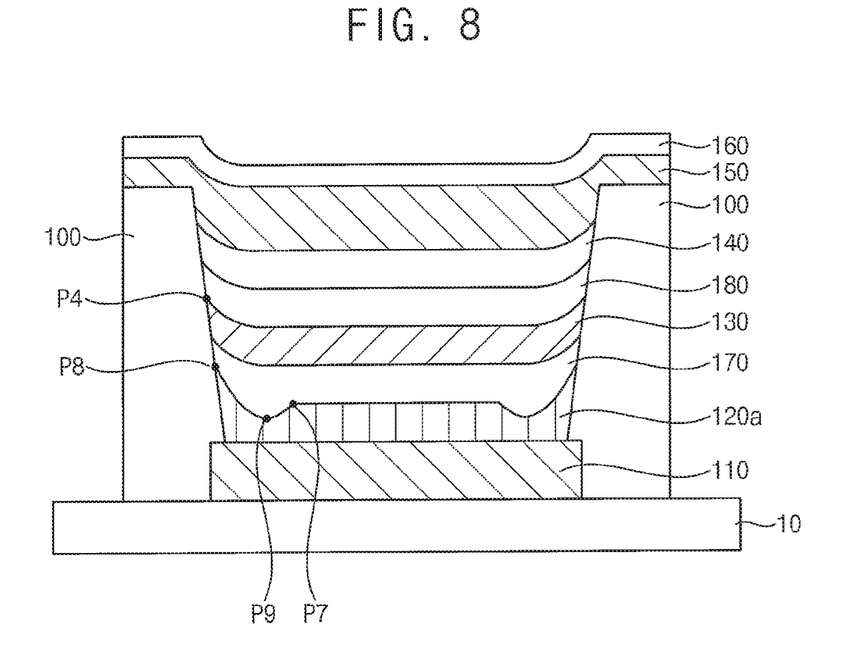
FIG. 8 is a cross-sectional view showing a display device in which a shape of an upper surface of a hole injection layer is modified from the display device in FIG. 7.

FIG. 8 is a cross-sectional view showing a display device in which a shape of an upper surface of a hole injection layer is modified from the display device in FIG. 7.

The display device in FIG. 8 may be substantially the same as or similar to the display device in FIG. 7 except for the shape of the upper surface of the hole injection layer 120a. Accordingly, description of repeated elements may not be repeated.

Figure 9:
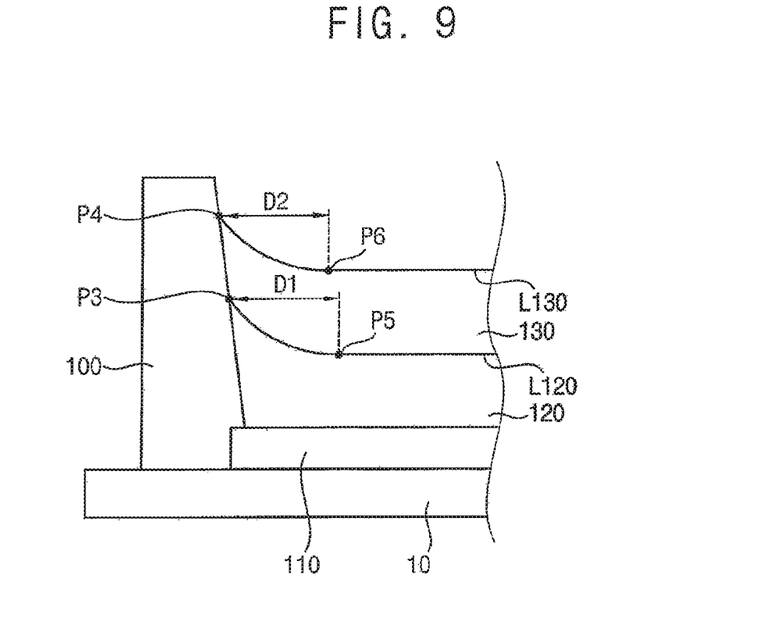
FIGS. 9 and 10 are cross-sectional views showing a horizontal distance of a curvature portion of each of the light emitting layer and the hole injection layer.
Figure 10:
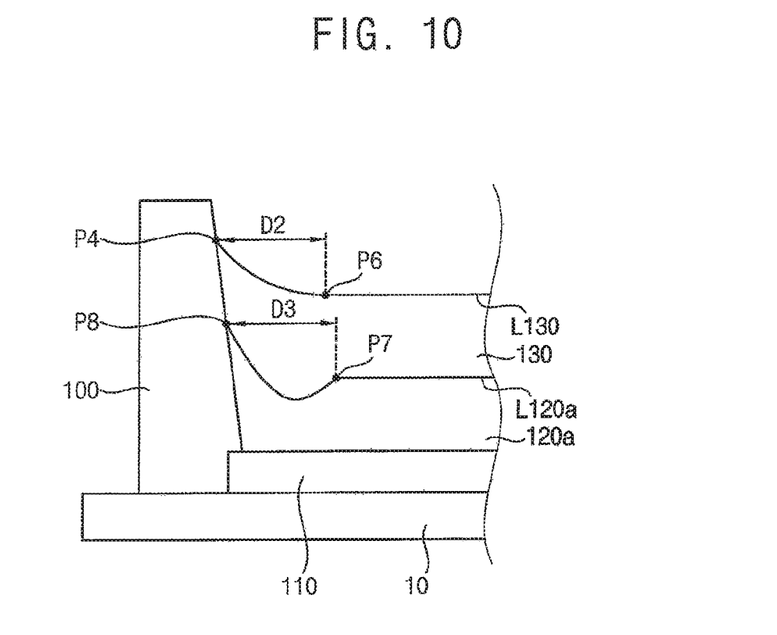

FIGS. 9 and 10 are cross-sectional views showing a horizontal distance of a curvature portion of each of the light emitting layer and the hole injection layer.

FIG. 9 shows a horizontal distance D1 between the first fixing point P3 where the side of the upper surface L120 of the hole injection layer 120 contacts the pixel defining layer 100 and a point P5 where the curvature portion of the side of the upper surface L120 of the hole injection layer 120 contacts the central (e.g., center) flat portion of the upper surface L120 of the hole injection layer 120 in FIGS. 1, 3, 5 and 7.

FIG. 9 shows a horizontal distance D2 between the second fixing point P4 where the side of the upper surface L130 of the light emitting layer 130 contacts the pixel defining layer 100 and a point P6 where the curvature portion of the side of the upper surface L130 of the light emitting layer 130 contacts the central (e.g., center) flat portion of the upper surface L130 of the light emitting layer 130.

Referring to FIG. 9, the horizontal distance D2 between the second fixing point P4 and the point P6 may be about 0.5 µm to about 3 µm, and preferably about 0.5 µm. As used herein, the term µm may refer to a distance equal to $10^{-6}$ meters.

The horizontal distance D1 between the first fixing point P3 and the point P5 may be about 0.5 µm to about 3 µm, and preferably about 0.5 µm.

FIG. 10 shows a horizontal distance D3 between the first fixing point P8 where the side of the upper surface L120a of the hole injection layer 120a contacts the pixel defining layer 100 and the point P7 where the curvature portion of the side of the upper surface L120a of the hole injection layer 120a contacts the central (e.g., center) flat portion of the upper surface L120a of the hole injection layer 120a in FIGS. 2, 4, 6 and 8.

Referring to FIG. 10, the horizontal distance D2 between the second fixing point P4 and the point P6 may be about 0.5 µm to about 3 µm, and preferably about 0.5 µm.

The horizontal distance D3 between the first fixing point P8 and the point P7 may be about 0.5 µm to about 3 µm, and preferably about 0.5 µm.

Figure 11:
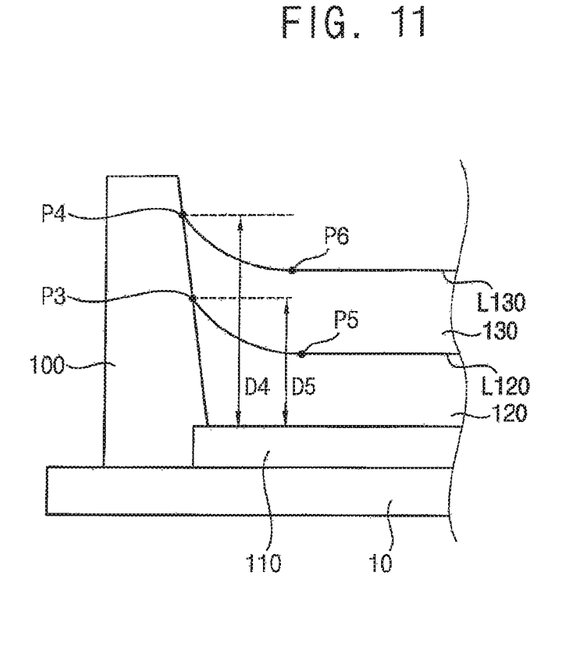
FIGS. 11 and 12 are cross-sectional views showing a position of a fixing point of each of the light emitting layer and the hole injection layer.
Figure 12:
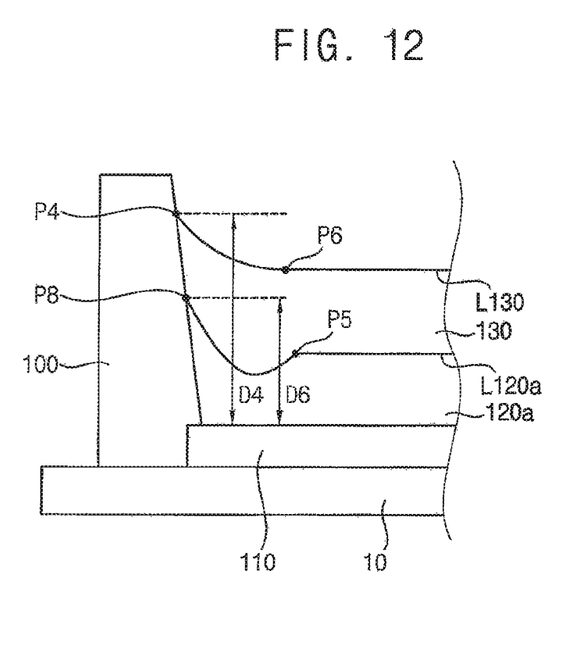

FIGS. 11 and 12 are cross-sectional views showing a position of a fixing point of each of the light emitting layer and the hole injection layer.

FIG. 11 shows a vertical distance D5 between the first fixing point P3 where the side of the upper surface L120 of the hole injection layer 120 contacts the pixel defining layer 100 and the upper surface of the first electrode 110 in FIGS. 1, 3, 5 and 7.

FIG. 11 shows a vertical distance D4 between the second fixing point P4 where the side of the upper surface L130 of the light emitting layer 130 contacts the pixel defining layer 100 and the upper surface of the first electrode 110.

The difference between vertical distance D4 between the second fixing point P4 and the upper surface of the first electrode 110 and the vertical distance D5 between the first fixing point P3 and the upper surface of the first electrode 110 may be greater than or equal to the insulation breakdown limit distance of the light emitting layer 130 at a set or predetermined voltage.

FIG. 12 shows a vertical distance D6 between the first fixing point P8 where the side of the upper surface L120a of the hole injection layer 120a contacts the pixel defining layer 100 and the upper surface of the first electrode 110 in FIGS. 2, 4, 6 and 8.

FIG. 12 shows the vertical distance D4 between the second fixing point P4 where the side of the upper surface L130 of the light emitting layer 130 contacts the pixel defining layer 100 and the upper surface of the first electrode 110.

The difference between the vertical distance D4 and the vertical distance D6 may be greater than or equal to the insulation breakdown limit distance at the set or predetermined voltage.

Figure 13:
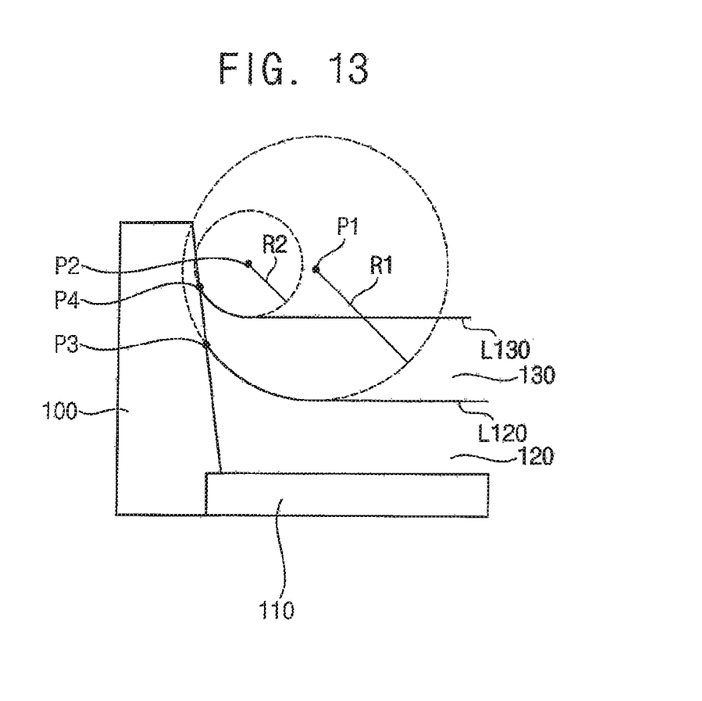
FIGS. 13 and 14 are cross-sectional views showing a curvature of a curvature portion of each of the light emitting layer and the hole injection layer.
Figure 14:
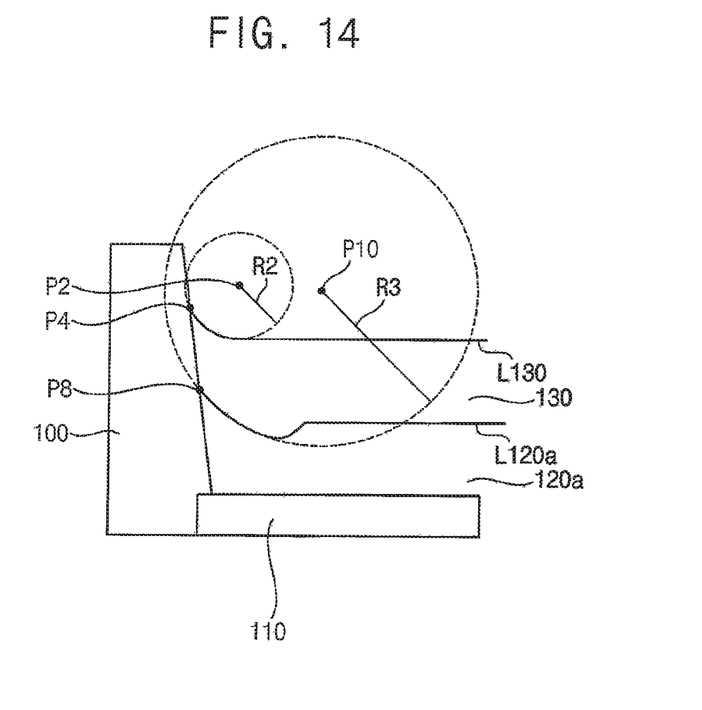

FIGS. 13 and 14 are cross-sectional views showing a curvature of a curvature portion of each of the light emitting layer and the hole injection layer.

FIG. 13 is a cross-sectional view showing a relationship between the first fixing point P3 where the side of the upper surface L120 of the hole injection layer 120 contacts the pixel defining layer 100 and the second fixing point P4 where the side of the upper surface L130 of the light emitting layer 130 contacts the pixel defining layer 100 in FIGS. 1, 3, 5 and 7.

If an imaginary circle is drawn on the curvature portion of the side of the upper surface L130 of the light emitting layer 130, the circle may have a center point P2 and a radius of curvature R2. If an imaginary circle is drawn on the curvature portion of the side of the upper surface L120 of the hole injection layer 120, the circle may have a center point P1 and a radius of curvature R1. The radius of curvature R2 may be less than or equal to the radius of curvature R1.

When the radiuses of curvatures are as described herein above, a distance difference between the second fixing point P4 and the first fixing point P3 may occur to prevent or reduce the current leakage.

FIG. 14 is a cross-sectional view showing a relationship between the first fixing point P8 where the side of the upper surface L120a of the hole injection layer 120a contacts the pixel defining layer 100 and the second fixing point P4 where the side of the upper surface L130 of the light emitting layer 130 contacts the pixel defining layer 100 in FIGS. 1, 3, 5 and 7.

If an imaginary circle is drawn on the curvature portion of the side of the upper surface L130 of the light emitting layer 130, the circle may have the center point P2 and the radius of curvature R2. If an imaginary circle is drawn on the curvature portion of the side of the upper surface L120a of the hole injection layer 120a, the circle may have a center point P10 and a radius of curvature R3. The radius of curvature R2 may be less than or equal to the radius of curvature R3.

When the radiuses of curvatures are as described herein above, a distance difference between the second fixing point P4 and the first fixing point P8 may occur to prevent or reduce the current leakage.

What is claimed is:

1. A display device, comprising:
    a substrate;
    a first electrode on the substrate;
    a pixel defining layer exposing an upper surface of the first electrode and covering a side of the first electrode;
    a second electrode on the first electrode;
    a hole injection layer between the first electrode and the second electrode, the hole injection layer having an upper surface having a side protruding in a direction toward the second electrode;
    a light emitting layer between the hole injection layer and the second electrode, the light emitting layer having an upper surface having a side protruding in the direction toward the second electrode; and
    an electron injection layer between the light emitting layer and the second electrode,
    wherein a shortest distance in a vertical direction between a first fixing point defined at a boundary between the side of the upper surface of the hole injection layer and the pixel defining layer and a second fixing point defined at a boundary between the side of the upper surface of the light emitting layer and the pixel defining layer is greater than or equal to an insulation breakdown limit distance of the light emitting layer, and
    wherein a radius of curvature of a curvature portion of the side of the upper surface of the hole injection layer is greater than a radius of curvature of a curvature portion of the side of the upper surface of the light emitting layer.

2. The display device of claim 1, further comprising a hole transport layer between the hole injection layer and the light emitting layer.

3. The display device of claim 2, wherein an ink repellency of the hole injection layer with respect to the pixel defining layer is greater than an ink repellency of the hole transport layer with respect to the pixel defining layer.

4. The display device of claim 1, further comprising an electron transport layer between the electron injection layer and the light emitting layer.

5. The display device of claim 1, wherein a horizontal distance from the first fixing point to a point between a flat portion of the upper surface of the hole injection layer and a curvature portion of the upper surface of the hole injection layer is within a range of 0.5 μm to 3 μm.

6. The display device of claim 1, wherein a horizontal distance from the first fixing point to a point between a flat portion of the upper surface of the hole injection layer and a curvature portion of the upper surface of the hole injection layer is 0.5 μm.

7. The display device of claim 1, wherein a horizontal distance from the second fixing point to a point between a flat portion of the upper surface of the light emitting layer and a curvature portion of the upper surface of the light emitting layer is within a range of 0.5 μm to 3 μm.

8. The display device of claim 1, wherein a horizontal distance from the second fixing point to a point between a flat portion of the upper surface of the light emitting layer and a curvature portion of the upper surface of the light emitting layer is 0.5 μm.

9. The display device of claim 1, wherein an ink repellency of the hole injection layer with respect to the pixel defining layer is greater than an ink repellency of the light emitting layer with respect to the pixel defining layer.

10. The display device of claim 1, wherein the upper surface of the hole injection layer has a 'U' shape.

11. The display device of claim 10, wherein the upper surface of the hole injection layer has a flat portion having a greater width than a width of the side of the upper surface of the hole injection layer.

12. The display device of claim 1, wherein the upper surface of the hole injection layer has a 'W' shape.

13. The display device of claim 12, wherein a height of a flat portion of the upper surface of the hole injection layer is less than a height of the first fixing point and greater than a height of a lowest point of a curvature portion of the upper surface of the hole injection layer, and
    wherein a width of the flat portion of the upper surface of the hole injection layer is greater than a width of the side of the upper surface of the hole injection layer.

14. The display device of claim 1, wherein the upper surface of the light emitting layer has a 'U' shape.

15. The display device of claim 14, wherein a width of a flat portion of the upper surface of the light emitting layer is greater than a width of the side of the upper surface of the light emitting layer.

* * * * *